United States Patent [19]

McDougall et al.

[11] Patent Number: 6,043,731
[45] Date of Patent: *Mar. 28, 2000

[54] CURRENT LIMITING DEVICE

[75] Inventors: Ian Leitch McDougall, Oxon; Peter Hanley, Gloucestershire, both of United Kingdom

[73] Assignee: Oxford Instruments PLC, Oxford, United Kingdom

[*] Notice: This patent issued on a continued prosecution application filed under 37 CFR 1.53(d), and is subject to the twenty year patent term provisions of 35 U.S.C. 154(a)(2).

[21] Appl. No.: 08/737,080

[22] PCT Filed: Mar. 22, 1996

[86] PCT No.: PCT/GB96/00712

§ 371 Date: Oct. 30, 1996

§ 102(e) Date: Oct. 30, 1996

[87] PCT Pub. No.: WO96/30990

PCT Pub. Date: Oct. 3, 1996

[30] Foreign Application Priority Data

Mar. 24, 1995 [GB] United Kingdom ............... 9506096

[51] Int. Cl.⁷ ..................................... H01L 43/00

[52] U.S. Cl. ............................ 338/32 S; 361/19; 505/881

[58] Field of Search ........................... 338/325; 505/881; 361/19

[56] References Cited

U.S. PATENT DOCUMENTS

| | | | |
|---|---|---|---|
| 3,141,979 | 7/1964 | Rinia et al. | 327/366 |
| 3,308,310 | 3/1967 | Burnett | 327/366 |
| 3,324,436 | 6/1967 | Uueller | 338/32 S |
| 3,394,335 | 7/1968 | Buchhold | 338/32 S |
| 3,488,617 | 1/1970 | Dietrich et al. | 338/32 S |
| 3,835,239 | 9/1974 | Schmidt et al. | 174/15 R |
| 3,925,707 | 12/1975 | Bhate et al. | 317/11 A |
| 4,375,659 | 3/1983 | Cunningham et al. | 361/19 |
| 4,700,257 | 10/1987 | Bekhaled | 361/19 |
| 4,855,859 | 8/1989 | Tixador et al. | 361/19 |
| 5,153,803 | 10/1992 | Rapeaux et al. | 361/19 |
| 5,241,447 | 8/1993 | Barber et al. | 361/19 |
| 5,379,020 | 1/1995 | Meier et al. | 361/19 |
| 5,414,586 | 5/1995 | Hara et al. | 361/19 |
| 5,475,560 | 12/1995 | Onihsi et al. | 361/19 |
| 5,546,261 | 8/1996 | Yoshida et al. | 361/19 |

FOREIGN PATENT DOCUMENTS

| | | | |
|---|---|---|---|
| 2 691 591 | 11/1993 | France . | |
| 1-185128 | 7/1989 | Japan . | |
| 1-206834 | 8/1989 | Japan . | |
| 1230579 | 5/1971 | United Kingdom | 361/19 |
| WO 94/03955 | 2/1994 | WIPO . | |

OTHER PUBLICATIONS

Tnanslation of 1–206834 (Kazuhiro).

Translation of 1–206834 (Hiroshi et al.).

*Primary Examiner*—Michael L. Gellner
*Assistant Examiner*—Karl Easthom
*Attorney, Agent, or Firm*—Staas & Halsey LLP

[57] ABSTRACT

A current limiting device having an electrical superconductor for attachment in an electrical circuit, the superconductor being made of material having a critical current density which varies with applied magnetic field. A magnetic field generator generates a magnetic field to which the superconductor is exposed. Under normal working conditions a magnetic field applied causes the critical current density to be less than a maximum critical current density. A controller adjusts the critical current density such that after a current carried by the superconductor exceeds the critical current density so that the superconductor transforms to a resistive state, the controller can be activated to increase the critical current density causing the superconductor to return the superconducting condition without terminating the flow of current through the superconductor.

25 Claims, 2 Drawing Sheets

CURRENT LIMITING DEVICE

BACKGROUND OF THE INVENTION

The invention relates to a current limiting device.

Current limiting devices are used in a wide variety of applications to handle fault conditions when a current surges above a safe limit. In high current applications such as power supply lines and the like, it has been known in the past to pass the current through a coil which is provided about a leg of an iron former. Another leg of the former provides the core of a superconducting coil which is activated to hold the iron former in a saturated condition. Thus, under normal conditions, the iron is saturated and so effectively the coil carrying the current sees an air core. When a fault occurs, the current rises causing a consequent increase in the magnetic field generated by the coil which opposes the field due to the superconducting coil. This causes an increase in the permeability of the iron core and this increases the voltage across the coil carrying the current which limits the current being carried.

Although this current fault limiter is effective, it is very expensive due to the need to provide the iron core and the complexities due to the need to cool the superconducting coil to liquid helium temperatures.

More recently, it has been proposed to use a superconducting switch. In this case, a length of high temperature (HTc) superconductor is placed into the circuit carrying the current. HTc materials have a critical temperature which is relatively high (typically equivalent to a liquid nitrogen temperature) and have a critical current (strictly current density) which varies inversely with an applied magnetic field. If the current carried by the superconductor exceeds the critical current then the material of the conductor makes a transition to a resistive state which acts to limit the current being carried. The critical current value at which this transition occurs can be changed by changing the applied magnetic field.

The main problem with this type of superconducting switch is that in order to reset the circuit it is necessary to break the electrical circuit completely to allow the superconductor to recover. This is due to a hysteresis effect which means that even if the current drops below the critical value, a transition back to the superconducting state will not occur because the passage of the current through the resistive material keeps the temperature high. The current has to be reduced virtually to zero for this reverse transition. Breaking the circuit is particularly undesirable since in many applications such a break cannot be tolerated.

SUMMARY OF THE INVENTION

In accordance with the present invention, a current limiting device comprises an electrical superconductor for attachment in an electrical circuit, the superconductor being made of material having a critical current density which varies with applied magnetic field; magnetic field generating means for generating a magnetic field to which the superconductor is exposed, whereby under normal working conditions a magnetic field is applied which causes the critical current density to be less than a maximum critical current density; and control means for adjusting the critical current density such that after a current carried by the superconductor exceeds the critical current density so that the superconductor transforms to a resistive state, the control means can be activated to increase the critical current density whereby the superconductor returns to the superconducting condition without terminating the flow of current through the superconductor.

The control means can increase the critical current density by reducing the applied magnetic field, reducing the temperature of the superconductor, or both.

At low but finite magnetic field levels, certain superconductors, particularly HTc superconductors, exhibit a variation of critical current with field which has a significant increase as field is decreased. It is therefore possible to significantly increase the critical current density temporarily by reducing the applied magnetic field towards or even to zero for a short while to allow the superconductor to recover its superconducting state while it continues to carry current and thus avoid the problems of the conventional superconducting switch.

It is also possible to raise the critical current density by lowering the temperature of the superconductor.

In some cases, the magnetic field generating means may comprise a power source connected to an electrical coil positioned relative to the superconductor so that the superconductor is exposed to a magnetic field generated by the coil.

It is possible, however, that the magnetic field generating means may be implemented in a simpler fashion without the need for an additional power source. Preferably, therefore, the magnetic field generating means includes an electrical shunt coil connected in parallel to the superconductor whereby when the superconductor transforms to the resistive state, current passes through the coil which generates a magnetic field to which the superconductor is exposed, and wherein the control means includes a switch for shorting the ends of the shunt coil. Typically, the shunt coil is positioned about the superconductor.

In this latter, preferred, arrangement making use of a shunt coil, as the current through the superconductor rises, the critical current density falls, and the excess current is shed into the shunt coil (or inductance). This provides an impedance to the fault current, and also generates a magnetic field additional to the self-field of the superconductor to ensure that the fault must be cleared before the superconductor can recover. By shorting the shunt coil, the magnetic field is removed allowing the critical current density to increase and thereby allowing the superconductor to return to its superconducting state. The short is then removed.

Typically, the superconducting material is formed of a relatively high temperature superconductor (e.g. one which superconducts at or above 77K). Our preferred superconductor comprises a thin film of high temperature superconducting material on a semi-conducting substrate such as a semiconductor or preferably a high resistance alloy whose resistivity increases with temperature. Further, by choosing the normal-state resistance to be as high as possible but compatible with protection and stabilisation, power dissipation can be minimised in the superconductor during fault-current conditions thus easing cooling and facilitating recovery. The very high normal-state resistance of high temperature superconductors also means that relatively high resistance conductors can be used to provide shunt current paths for local protection.

A problem which can arise in some circumstances occurs after the superconductor has transformed into a resistive state. In this state, the passage of current through the conductor will generate heat and this can affect the critical current density. Although the superconductor will normally be cooled to achieve its superconducting state, this may not be sufficient to deal with heat surges when the superconductor turns resistive. Preferably, therefore, the device further comprises a cooling device for removing heat when the superconductor is in the resistive state.

The cooling device could be a passive device such as a large thermal mass surrounding the superconductor or an active device including a component such as a cryocooler for cooling a cooling medium such as liquid FREON® surrounding the superconductor.

In some applications the electrical superconductor will be connected in series in the electrical circuit. In other applications, the electrical superconductor forms the secondary of a transformer and is short-circuited, the primary being connected in the electrical circuit.

BRIEF DESCRIPTION OF THE DRAWINGS

Some examples of a current limiting device according to the invention will now be described with reference to the accompanying drawings, in which.

DESCRIPTION OF THE PREFERRED EMBODIMENTS

Figure 1:
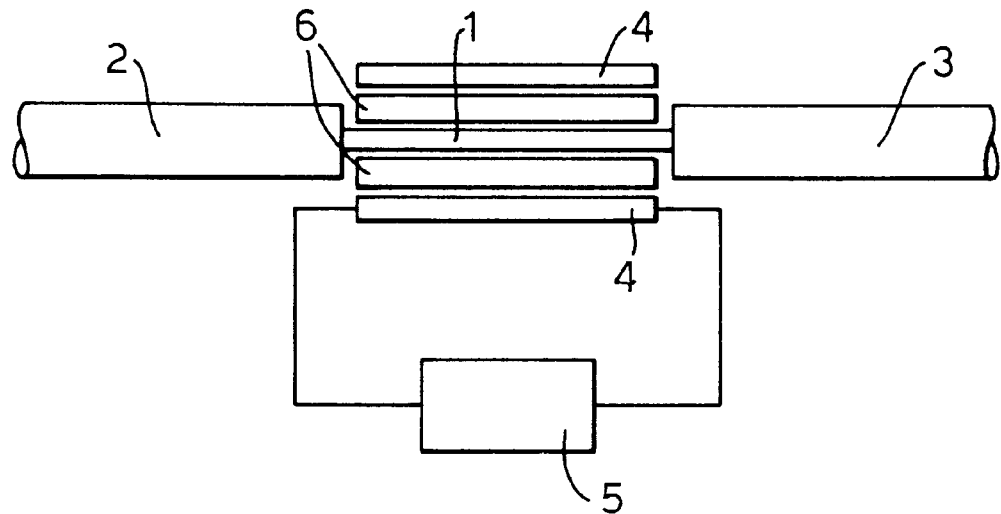
FIG. 1 is a schematic, cross sectional of a first example of the device.

The fault limiting device shown in FIG. 1 comprises a wire 1 of high temperature superconductor such as $YBa_2Cu_3O_7$ extending between cables 2,3 of an electric circuit (not shown). The superconductor 1 is connected to a shunt impedance (not shown) and is surrounded by a cryostat 6 containing a cooling medium such as liquid nitrogen to maintain the temperature of the superconductor below its critical temperature (77K). A magnet 4 is positioned about the superconductor 1 and is connected to a power source and control device 5.

Figure 2:
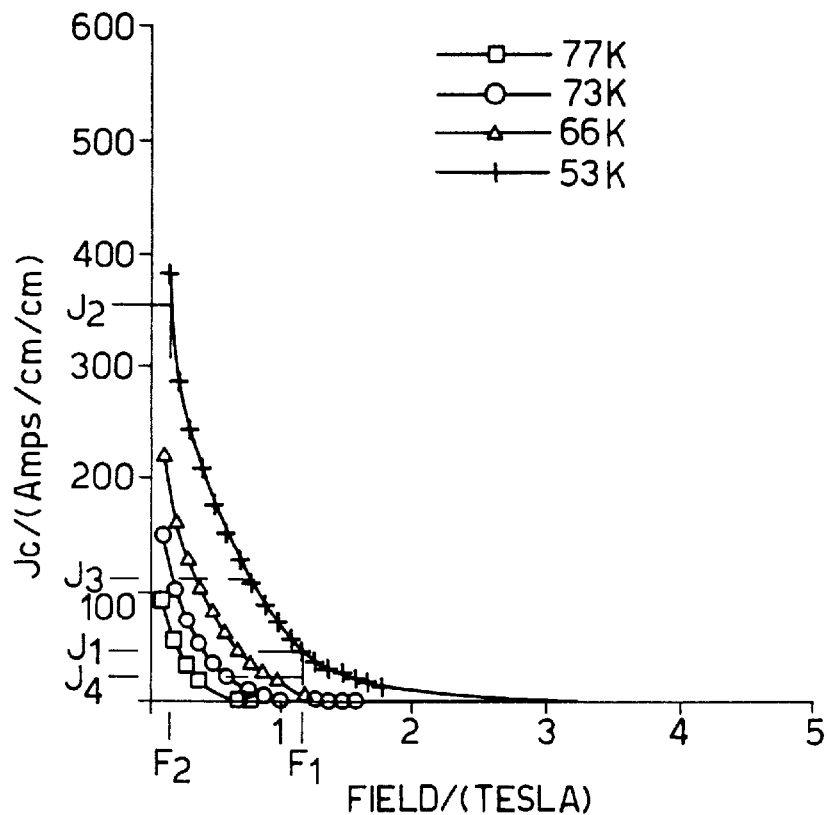
FIG. 2 illustrates the variation of critical current density with field at various temperatures of a typical high temperature superconductor.

It is known that a superconductor of the type shown in FIG. 1 has a critical current density which varies with applied magnetic field. This critical current density $J_c$ defines a current density above which the superconductor transforms to its resistive state and below which the superconductor exists in its persistent or superconducting state. FIG. 2 illustrates the variation of critical current density with field at a number of temperatures at or below 77K of a typical high temperature superconductor. It can be seen that the critical current density is relatively high at low fields and decreases almost to zero at high fields. It can also be seen that there is a variation of critical current with temperature and this is shown more clearly in FIG. 3 which illustrates surfaces of constant electric field.

In normal operation, the control device 5 is controlled to generate a current through the magnet 4 so that the magnet generates a steady magnetic field $F_1$ (see FIG. 2) and this will define a critical current density $J_1$. Providing current flowing through the superconductor 1 is below the critical current density $J_1$, the superconductor 1 will remain in its superconducting state. However, if a fault develops causing a current surge, the current will rise above the critical current density $J_1$, for example to a value $J_3$, causing the superconductor 1 to revert to its resistive state. In this state, the superconductor acts to limit the flow in current as required.

When it is desired to cause the superconductor 1 to return to its superconducting state, when the conducted current has returned to a normal level $J_4$, the control device 5 is instructed to reduce the applied magnetic field either to zero or to a low value $F_2$. As can be seen in FIG. 2, this will cause a rapid increase in the critical current to a value $J_2$. At this level, the current $J_4$ passing through the superconductor 1 is sufficiently low relative to the critical current that the superconductor 1 reverts to its superconducting state. The magnetic field is then controlled by the controller 5 to return to its normal level $F_1$.

The need to make this adjustment in the critical current density is because the superconductor 1 exhibits a hysteresis effect due to increases in temperature caused by the flow of current through the superconductor in its resistive state. Thus, once it has transferred into its resistive state, it is not sufficient simply to cause the current to drop below the critical current density $J_1$. Below this level, the superconductor 1 remains in the resistive state and will only turn back to a superconducting state if the current were decreased to a very low level indeed. However, by raising the critical current density itself by a significant amount, it is possible to turn the superconductor to its superconducting state without needing to decrease the current.

Figure 3:
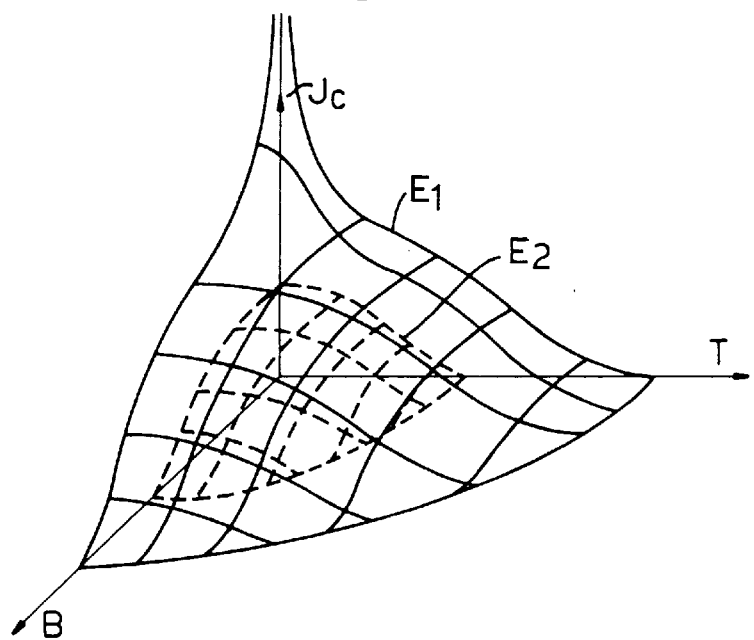
FIG. 3 illustrates surfaces of constant electric field (or voltage) in (B-T-J) space for two different fields $E_1$ and $E_2$ and, FIG. 4 is a schematic, cross sectional of a second example.

It can be seen from FIG. 3 that $J_c$ varies with field and temperature and so it is also important to ensure that the temperature of the superconductor does not increase significantly so that reducing the applied field is not sufficient by itself to bring the current significantly below the new critical current density. Thus, it is important to maintain the temperature of the superconductor relatively constant.

The temperature dependence of the critical current density can, however, be utilised in addition or instead of adjusting the magnetic field to reestablish the superconducting condition. Thus, by reducing the temperature of the cryostat 6, the critical current density can be increased.

Figure 4:
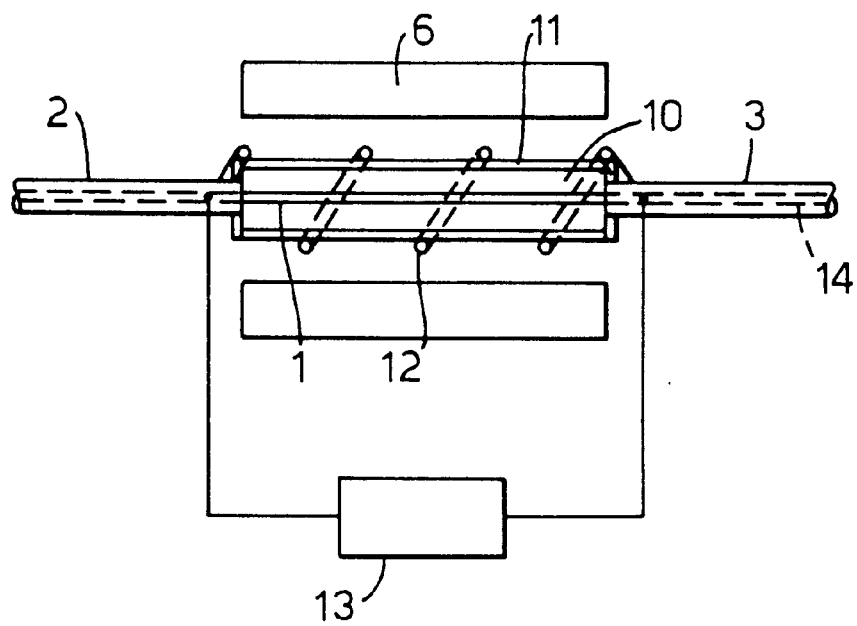

FIG. 4 illustrates a second example of a fault limiting device. In this case, the superconductor comprises a semiconducting substrate, for example a high resistance alloy 10 on which is provided a thin film of high temperature superconducting material 11. As before, cables 2,3 are connected to the superconductor which is surrounded by a cryostat containing liquid nitrogen 6. A shunt coil 12 is wound around the superconductor and is connected electrically in parallel with the superconductor. In addition, the shunt coil 12 is connected to a switch 13 which is normally open. Additional cooling medium such as water or FREON® is supplied through the centre of the substrate 10 via a conduit 14.

In this example, as current increases, the self-field due to the current in the superconductor will cause the critical current density to lower so that the superconductor sheds current into the coil 12. This shed current flows in the coil 12 (which is resistive) causing a magnetic field to be generated to which the superconductor is exposed thereby decreasing still further the critical current density. As before, a point is reached at which the superconductor changes into its resistive state with the superconductor and shunt coil forming a high impedance. When the current demanded has returned to its normal level, the superconductor can be turned back to its superconducting state by closing the switch 13 for a short moment thereby removing the magnetic field.

Use of the self-field effect may require the additional sensing of the current so as rapidly to cause the superconducting element to turn normal. The reason for this is as follows:

Consider a FCL which consists in essence of a high-temperature-superconducting element in series with the line.

This element is sufficiently long that, in the normal state, its resistance is high enough to limit the current through it to a low value. In the superconducting state, it can carry a current up to a value Ic without dissipation of power.

In practice, the superconducing element will not be uniform, and some parts will have a lower critical current density than others. If a fault occurs, such as a short circuit, where the current attempts to grossly exceed Ic, this does not matter, and all the element will become normal, have a high resistance and limit the current to a safe value.

If, instead of a short circuit, the fault gives rise to a small overload so that the fault current has a value of about Ic, then because of the non-uniformity of the element, some of the superconductor will become normal, but much of it will remain superconducting. The resistance will initially be very small and the current will not be limited. The resistive region will heat up and then propogate along the element due to thermal conduction. The velocity of propagation will be of the order of:

$$J\sqrt{(rho\ k/(Ts-To))}/C$$

where J is the current density, rho is the resistivity, k is the thermal conductivity, Ts is the superconducting critical temperature, To is the initial temperature and C is the volume specific heat. (Broom & Rhoderick, B J Appl Phys, 11, 292, 1960).

For a typical high temperature superconductor at 77K, and a current density of 1000 MA/sq m, this velocity is of the order of 0.1 m per sec. The length of the element might be of the order of 10 m, so that the time taken for the element to become resistive could be several minutes.

Because of the high current density the temperature of the resistive portion will rise rapidly, and the element would burn out unless the current could be reduced within a few tens of milliseconds.

For this reason it is desirable to sense the onset of resistance, and then rapidly lower the critical current of all the element below the fault current.

EXAMPLE 1

A specific example of a series connected fault current limiting device (FCL) will now be described. This consists of a bar of superconductor, characterised by
thickness, t
width, b
length, L The face of width b is assumed to be cooled, by contact with liquid nitrogen.

In the superconducting state:

$$I_{max}=J_c bt$$

where

Imax is the maximum current the device has to carry under no-fault conditions; and, $J_c$ is critical current density.

Under fault conditions (resistive state):

$$I_{fault} = \frac{Vbt}{\phi L}$$

$$\text{Heat transfer } W = \frac{V^2 t}{\phi L^2}$$

$$\beta = \frac{I_{fault}}{I_{max}} = \frac{V}{J_c \phi L}$$

$$= \frac{1}{J_c \sqrt{\phi}} \sqrt{\frac{W}{t}}$$

where

V is voltage rating. Assuming the power system has zero output impedance, and the worst case fault is a short circuit, then V is a constant voltage appearing across the device.

$\phi$ is normal state resistivity.

W is heat transfer per unit area (Watts/sq. meter)

For a given heat transfer, therefore, the isolation ($\beta$) is determined by the quantity $J_c\sqrt{\phi}$.

The isolation is tabulated below as a function of $J_c\sqrt{\phi}$ and t:

| W | rho | Imax | V |
|---|---|---|---|
| 1.00E + 05 | 5.00E − 06 | 630 | 24000 |

| t = 1.00E − 06 | 3.00E − 06 | 1.00E − 05 | 3.00E − 05 |
|---|---|---|---|
| 1.00E − 04 | 3.00E − 04 | | |

| JcVø | β | | | | | |
|---|---|---|---|---|---|---|
| 1.00E + 04 | 3.16E + 01 | 1.83E + 01 | 1.00E + 01 | 5.77E + 00 | 3.16E + 00 | 1.83E + 00 |
| 3.00E + 04 | 1.05E + 01 | 6.09E + 00 | 3.33E + 00 | 1.92E + 00 | 1.05E + 00 | 6.09E − 01 |
| 1.00E + 05 | 3.16E + 00 | 1.83E + 00 | 1.00E + 00 | 5.77E − 01 | 3.16E − 01 | 1.83E − 01 |
| 3.00E + 05 | 1.05E + 00 | 6.09E − 01 | 3.33E − 01 | 1.92E − 01 | 1.05E − 01 | 6.09E − 02 |
| 1.00E + 06 | 3.16E − 01 | 1.83E − 01 | 1.00E − 01 | 5.77E − 02 | 3.16E − 02 | 1.83E − 02 |
| 3.00E + 06 | 1.05E − 01 | 6.09E − 02 | 3.33E − 02 | 1.92E − 02 | 1.05E − 02 | 6.09E − 03 |
| 1.00E + 07 | 3.16E − 02 | 1.83E − 02 | 1.00E − 02 | 5.77E − 03 | 3.16E − 03 | 1.83E − 03 | where rho is the normal-state resistivity of the superconducting element (ohm-meters).
Below are shown the dimensions of an FCL for two values of isolation.

-continued

B = 0.1 power = 1.51E + 06

| Jc√ø | Jc A/m² | t m | b m | L m | volume m³ |
|---|---|---|---|---|---|
| 1.00E + 04 | 4.47E + 06 | 1.00E − 01 | 1.41E − 03 | 1.07E + 04 | 1.51E + 00 |
| 3.00E + 04 | 1.34E + 07 | 1.11E − 02 | 4.23E − 03 | 3.58E + 03 | 1.68E − 01 |
| 1.00E + 05 | 4.47E + 07 | 1.00E − 03 | 1.41E − 02 | 1.07E + 03 | 1.51E − 02 |
| 3.00E + 05 | 1.34E + 08 | 1.11E − 04 | 4.23E − 02 | 3.58E + 02 | 1.68E − 03 |
| 1.00E + 06 | 4.47E + 08 | 1.00E − 05 | 1.41E − 01 | 1.07E + 02 | 1.51E − 04 |
| 3.00E + 06 | 1.34E + 09 | 1.11E − 06 | 4.23E − 01 | 3.58E + 01 | 1.68E − 05 |
| 1.00E + 07 | 4.47E + 09 | 1.00E − 07 | 1.41E + 00 | 1.07E + 01 | 1.51E − 06 |

B = 0.01 power = 1.51E + 05

| Jc√ø | Jc A/m² | t m | b m | L m | volume m³ |
|---|---|---|---|---|---|
| 1.00E + 04 | 4.47E + 06 | 1.00E + 01 | 1.41E − 05 | 1.07E + 05 | 1.51E − 01 |
| 3.00E + 04 | 1.34E + 07 | 1.11E + 00 | 4.23E − 05 | 3.58E + 04 | 1.68E − 02 |
| 1.00E + 05 | 4.47E + 07 | 1.00E − 01 | 1.41E − 04 | 1.07E + 04 | 1.51E − 03 |
| 3.00E + 05 | 1.34E + 08 | 1.11E − 02 | 4.23E − 04 | 3.58E + 03 | 1.68E − 04 |
| 1.00E + 06 | 4.47E + 08 | 1.00E − 03 | 1.41E − 03 | 1.07E + 03 | 1.51E − 05 |
| 3.00E + 06 | 1.34E + 09 | 1.11E − 04 | 4.23E − 03 | 3.58E + 02 | 1.68E − 06 |
| 1.00E + 07 | 4.47E + 09 | 1.00E − 05 | 1.41E − 02 | 1.07E + 02 | 1.51E − 07 |

EXAMPLE 2

This consists of a transformer 20, whose primary 21 is in series with the load 22, and whose secondary 23 consists of a shorted turn of superconductor. There is also provided a shorting switch 24 which is equivalent to the shorting switch 13 shown in FIG. 4 and described in the second example.

If the turns ratio is α, and the load impedance is $Z_L$, when the secondary is superconducting, the currents (in amperes are:

$$I_1 = \frac{V}{Z_L} \quad I_2 = \frac{\alpha V}{Z_l}$$

where $I_1$ is the current in the primary circuit (in-line winding)
$I_2$ is the current in the secondary circuit (the superconductive shorted turn)

Under fault conditions, when $Z_L = 0$ and the secondary has resistance R, $$I_1 = \frac{V}{R\alpha^2} - \frac{jV}{L_1 \omega} \quad I_2 = \frac{V}{R\alpha}$$

where $L_1$ is the inductance of the primary winding (henries).
The fault current magnitude is therefore:

$$I_{fault} = \frac{V\sqrt{L_1^2 \omega^2 + R^2 \alpha^2}}{L_1 \omega R \alpha^2}$$

$$I_{max} = \frac{I_c}{\alpha}$$

$$\beta = \frac{V}{R\alpha I_c} \sqrt{1 + \left(\frac{R\alpha}{\omega L_1}\right)^2}$$

Two possible configurations for the superconducting secondary are possible:

a) A stack of N disks—effectively N turns in parallel.
b) A cylinder—a single turn.

Considering a) first:

$$I_c = J_c N t (a_2 - a_1)$$

$$R = \frac{2\pi\phi}{Nt \ln\left(\frac{a_2}{a_1}\right)}$$

$$\beta = \frac{V \ln\left(\frac{a_2}{a_1}\right)}{2\pi\alpha\phi J_c (a_2 - a_1)} \sqrt{1 + \left(\frac{R\alpha}{\omega L_1}\right)^2}$$

where $a_1$ and $a_2$ are the inner and outer radii of the disks. In terms of the peak heat transfer (which occurs at the inner radius):

$$\beta = \frac{1}{J_c \sqrt{\phi}} \sqrt{\frac{W}{t}} \cdot \frac{\ln\left(\frac{a_2}{a_1}\right)}{\frac{a_2}{a_1} - 1} \cdot \sqrt{1 + \left(\frac{R\alpha}{\omega L_1}\right)^2}$$

This is essentially the same as for the "series resistor" of Example 1, except for-two factors. The final factor can in principle be made to approach unity, with a large enough inductance. The other factor, ln(x)/(x−1) is about unity for a narrow annulus, and has the values

| $a_2/a_1$ = | 1 | 2 | 3 | 4 | 5 |
|---|---|---|---|---|---|
| ln(x)/x − 1 = | 1.0 | 0.69 | 0.55 | 0.46 | 0.40 |

For case b, the secondary takes the form of a cylinder, of radius a, thickness t, and length L. The surface is cooled.

$$I_c = J_c L t$$

$$R = \frac{2\pi a \phi}{L t}$$

-continued $$\beta = \frac{V}{2\pi a \phi \alpha J_c} \sqrt{1 + \left(\frac{R\alpha}{\omega L_1}\right)^2}$$

$$= \frac{1}{J_c \sqrt{\phi}} \sqrt{\frac{W}{t}} \cdot \sqrt{1 + \left(\frac{R\alpha}{\omega L_1}\right)^2}$$

What is claimed is:

1. A current limiting device comprising:
   an electrical superconductor made of material having a critical current density which varies with an applied magnetic field;
   magnetic field generating means for generating and applying, during normal operation wherein said semiconductor is in a superconducting condition having load current carried therethrough, a magnetic field to said superconductor causing the critical density to be less than a maximum critical current density; and
   control means for adjusting the critical current density such that after the load current carried by the superconductor exceeds the critical current density, so that the superconductor transforms to a resistive state, the control means increases the critical current density whereby the superconductor returns to the superconducting condition without terminating the flow of the load current through the superconductor.

2. A device according to claim 1, wherein the superconductor is a high temperature superconductor.

3. A device according to claim 2, wherein the magnetic field generating means defines a first axis and wherein the superconductor is elongate along a second axis, the superconductor being disposed such that the first axis is co-axial with the second.

4. A device according to claim 2, wherein the magnetic field generating means includes a power source connected to an electrical coil positioned relative to the superconductor so that the superconductor is exposed to a magnetic field generated by the coil.

5. A device according to claim 2, wherein the control means controls the magnetic field generating means to increase the critical current density.

6. A device according to claim 2, further comprising a cooling device for removing heat when the superconductor is in the resistive state.

7. A device according to claim 1, wherein the magnetic field generating means defines a first axis and wherein the superconductor is elongate along a second axis, the superconductor being disposed such that the first axis is co-axial with the second axis.

8. A device according to claim 7, wherein the magnetic field generating means includes a power source connected to an electrical coil positioned relative to the superconductor so that the superconductor is exposed to a magnetic field generated by the coil.

9. A device according to claim 7, wherein the control means controls the magnetic field generating means to increase the critical current density.

10. A device according to claim 7, further comprising a cooling device for removing heat when the superconductor is in the resistive state.

11. A device according to claim 1, wherein the magnetic field generating means includes a power source connected to an electrical coil positioned relative to the superconductor so that the superconductor is exposed to a magnetic field generated by the coil.

12. A device according to claim 11, wherein the control means controls the magnetic field generating means to increase the critical current density.

13. A device according to claim 1, wherein the magnetic field generating means includes an electrical shunt coil connected in parallel to the superconductor whereby when the superconductor transforms to the resistive state, current passes through the coil which generates a magnetic field to which the superconductor is exposed, and wherein the control means includes a switch for shorting the ends of the shunt coil.

14. A device according to claim 13, wherein the shunt coil is positioned around the superconductor.

15. A device according to claim 1, further comprising a cooling device for removing heat when the superconductor is in the resistive state.

16. A device according to claim 15, wherein the cooling device comprises a cooling medium.

17. A device according to claim 16, wherein the cooling medium comprises fluorocarbon.

18. An electrical circuit comprising:
    a current limiting device having:
       an electrical superconductor, for attachment in the electrical circuit, made of material having a critical current density which varies with an applied magnetic field;
       magnetic field generating means for, during normal operation, generating a magnetic field to the superconductor causing the critical current density to be less than a maximum critical current density; and
       control means for, during abnormal operation in which a load current carried by the superconductor exceeds the critical current density, transforming the superconductor to a resistive state, by increasing the critical current density of the electrical semiconductor whereby the superconductor returns to the superconducting condition without terminating the flow of the load current through the superconductor.

19. A circuit according to claim 18, wherein the electrical superconductor of the current limiting device forms the secondary of a transformer and is short-circuited, the primary being connected in the electrical circuit.

20. A method of current limiting comprising:
    applying a magnetic field to a superconductor, made of material having a critical current density which varies with applied magnetic field, to cause the critical current density to be less than a maximum critical current density during normal operation; and
    after a current carried by the superconductor exceeds the critical current density, so that the superconductor transforms to a resistive state, increasing the critical current density to cause the superconductor to return to the superconducting condition without terminating the flow of the load current through the superconductor.

21. A method according to claim 20, comprising increasing the critical current density by decreasing the applied magnetic field.

22. A method according to claim 21, further comprising:
    connecting an electrical shunt coil in parallel to the superconductor such that when the superconductor transforms to the resistive state, current passes through the coil which generates a magnetic field to which the superconductor is exposed; and
    closing the switch to short the ends of the shunt coil to decrease the applied magnetic field.

23. A method according to claim 20, further comprising increasing the critical current density by removing heat from the superconductor.

24. A current limiting device comprising:

an electrical superconductor made of material having a critical current density which varies with an applied magnetic field;

a magnetic field generator which generates a variable magnetic field around the superconductor; and a controller which during normal operation causes the magnetic field generator to generate a magnetic field that causes the critical density of the electrical superconductor to be less than a maximum critical current density and when a load current carried by the superconductor exceeds the critical current density, varies the magnetic field so as to transform the superconductor to a resistive state, causing the superconductor to return to the superconducting condition without terminating the flow of load current through the superconductor.

25. A current limiting device comprising:

an electrical superconductor made of material having a critical current density which varies with an applied magnetic field;

magnetic field generating means for generating and applying, during normal operation wherein said semiconductor is in a superconducting condition having load current carried therethrough, a magnetic field to said superconductor causing the critical density to be less than a maximum critical current density; and control means for adjusting the magnetic field such that after the load current carried by the superconductor exceeds the critical current density, so that the superconductor transforms to a resistive state, the control means increases the critical current density whereby the superconductor returns to the superconducting condition without terminating the flow of the load current through the superconductor.

* * * * *